United States Patent [19]

Katoh et al.

[11] Patent Number: 5,362,603
[45] Date of Patent: Nov. 8, 1994

[54] PHOTOPOLYMERIZABLE COMPOSITION FOR COLOR FILTER AND COLOR FILTER PREPARED THEREFROM

[75] Inventors: Yoshinori Katoh, Yono; Naoko Ichinose, Sagamihara; Teruhito Sotogoshi, Miyashiromachi, all of Japan

[73] Assignee: Nippon Kayaku Kabushiki Kaisha, Tokyo, Japan

[21] Appl. No.: 969,232

[22] PCT Filed: May 14, 1992

[86] PCT No.: PCT/JP92/00612

§ 371 Date: Feb. 24, 1993

§ 102(e) Date: Feb. 24, 1993

[87] PCT Pub. No.: WO92/21067

PCT Pub. Date: Nov. 26, 1992

[30] Foreign Application Priority Data

May 17, 1991 [JP] Japan .................. 3-140781

[51] Int. Cl.⁵ .................. G03C 1/725; G03F 9/00
[52] U.S. Cl. .................. 430/281; 430/7; 522/34; 522/36; 522/39; 522/96; 522/107; 522/109; 522/121
[58] Field of Search .................. 430/281, 7; 522/34, 522/36, 39, 96, 107, 109, 121

[56] References Cited

U.S. PATENT DOCUMENTS 4,604,342  8/1986  Sondergeld et al. ............ 430/281
4,933,259  6/1990  Chihara et al. ................. 430/281
4,992,547  2/1991  Berner et al. .................. 544/162
5,077,402  12/1991  Desobry et al. ................. 522/34

FOREIGN PATENT DOCUMENTS 0035574  9/1981  European Pat. Off. .
0155652  9/1985  European Pat. Off. .
0284561  9/1988  European Pat. Off. .
0306273  3/1989  European Pat. Off. .
0320264  6/1989  European Pat. Off. .
0359934  3/1990  European Pat. Off. .
60-84248  5/1985  Japan .
60-129738  7/1985  Japan .
60-129739  7/1985  Japan .
61-87151  5/1986  Japan .
61-188534  8/1986  Japan .
1152449  6/1989  Japan .
1254918  10/1989  Japan .
2804  1/1990  Japan .
2153353  6/1990  Japan .

*Primary Examiner*—Marion E. McCamish
*Assistant Examiner*—Mark A. Chapman
*Attorney, Agent, or Firm*—Nields & Lemack

[57] ABSTRACT

The present invention relates to a photopolymerizable composition containing a photopolymerizable compound having at least one ethylenically unsaturated double bond, a photopolymerization initiator, a pigment and optionally another resin, wherein said photopolymerizable compound contained therein comprises not less than 60%.

15 Claims, 1 Drawing Sheet

Spectrum of Color Filter

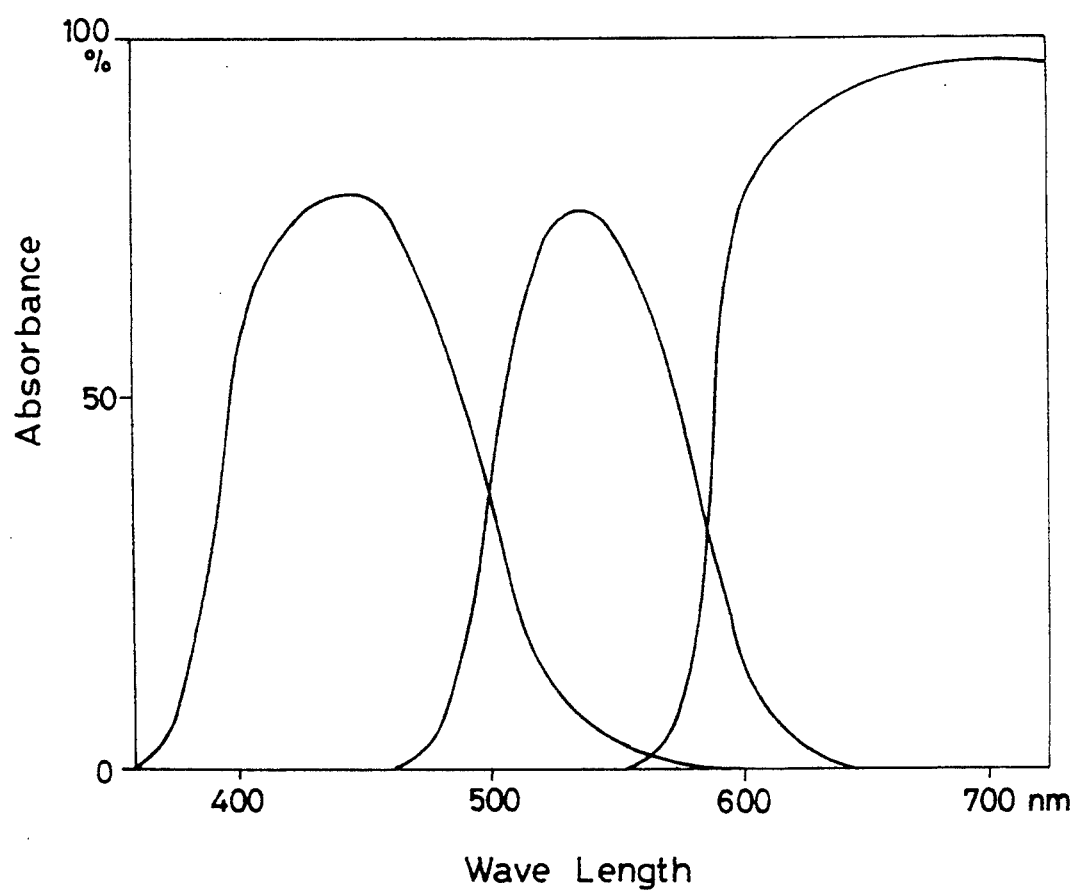
Figure 1. Spectrum of Color Filter

PHOTOPOLYMERIZABLE COMPOSITION FOR COLOR FILTER AND COLOR FILTER PREPARED THEREFROM

TECHNICAL FIELD

The present invention relates to a composition for color filter and a color filter prepared therewith. More particularly, the present invention relates to a photopolymerizable composition for color filter having an excellent optical property for use in a liquid crystal display device, a color separation device, a sensor, and the like, and a color filter prepared therewith.

BACKGROUND TECHNOLOGY

A color filter used for a color image pick-up device which finds a big demand for a VTR camera and a color copying machine, and for a liquid crystal color display device replacing for a CRT system because of a tendency to be lighter and thinner, is formed by providing minute areas colored with at least two kinds of hue, on a solid image pick-up device or a transparent substrate.

So far, such a colored thin film has been prepared by dyeing or printing method, and when an espcially high definition image is required, the dyeing method has mainly been used.

However, a color filter by the dyeing method is usually manufactured by forming in advance an image on a substrate with a dyeable base material, such as, a natural photosensitive resin, for instance gelatine, an amine modified polyvinyl alcohol, an amine modified acrylic resin, or the like, followed by dyeing with a dye such as an acid dye, etc. and, since it is necessary to form multiple colors on the same substrate, a protection process against dyeing must be done every time the color is changed, and this invites a problem that the process is very complex and long. Further, as light resistance, heat resistance and moisture resistance of dyes and resins used are generally low, color filters prepared therewith also have relatively unreliable light, heat and moisture resistance.

A color filter by the printing method is manufactured by printing with an ink which is prepared by dispersing a pigment in a thermo- or photosetting resin, and then curing the resin by heat or light. However, with this color filter, a high definition image is difficult to form and the image obtained has a problem in its surface smoothness. In order to make the process simpler, a method to disperse or dissolve coloring matters in the resin in advance has been proposed.

For example, Japanese Patent Application Laid-open (Kokai) Nos. 1-152449; 1-254918; 2-153353 and 2-804 propose methods for forming a multicolor pattern by dispersing pigments in a photosensitive resin containing a multifunctional acrylate monomer and a highly sensitive halomethyl-s-triazine photopolymerization initiator. These processes are simpler than the formation of a color filter by the dyeing method. As the resins and pigments used have high heat and light resistance, the filters manufactured by these processes are generally more reliable than the filters made by the dyeing method. However, since radicals generated from the photopolymerization initiator during photopolymerization are trapped by oxygen, those photosensitive resin materials cannot be cured sufficiently under the condition exposed to air. As the result, after the photopolymerizable composition is coated and dried, it is necessary to form a film (an oxygen blocking film) of PVA, etc. further on the coated composition to block oxygen. Accordingly, there remains some troubles in view of simplifying the process.

On the other hand, Japanese Patent Application Laid-open (Kokai) Nos. 60-129738 and 60-129739 propose a method in which the oxygen film is not required. This method employs a coloring composition using a photosensitive PVA-stilbazolium cross-linking resin. However, since the base resin is PVA which has low heat resistance and is water soluble, there remains a problem of its moisture resistance. Further, as the boiling point of water is low, it is disadvantageous to spin-coat the composition on a large size substrate.

DISCLOSURE OF THE INVENTION

An object of the present invention is to develop a photopolymerizable composition for a color filter which has excellent light and heat resistance, and good image resolution and can be manufactured by a simple process.

The present inventors have extensively studied to find out a method for the preparation of a color filter which-has excellent light and heat resistance, and good image resolution and can be manufactured by a simple process as described before and as a result have found that a specific photopolymerizable composition can fulfil the aforementioned features. Accordingly, the present invention has been attained.

Namely, the present invention provides:

(1) A photopolymerizable composition for color filter containing a photopolymerizable compound having at least one ethylenically unsaturated double bond, a photopolymerization initiator, a pigment and optionally another resin, characterized in that said photopolymerizable compound contained comprises not less than 60%.

(2) The photopolymerizable composition for color filter described in item (1) above, wherein the photopolymerizable compound is a photopolymerizable compound having an average molecular weight of not less than 1000.

(3) The photopolymerizable composition for color filter described in item (1) above, wherein the photopolymerization initiator is a mixture comprising a compound represented by the formula (1):

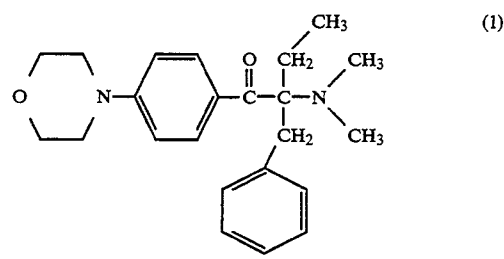

a thioxanthone compound and optionally another photopolymerization initiator.

(4) The photopolymerizable composition for color filter described in item (3) above, wherein the other photopolymerization initiator comprises a hexaaryl-bisimidazole compound and a hydrogen donor.

(5) The photopolymerizable composition for color filter described in item (4) above, wherein the hydrogen donor is an aromatic mercaptan.

(6) The photopolymerizable composition for color filter described in item (4) above, wherein said hydrogen donor is an aromatic amine.

(7) The photopolymerizable composition for color filter described in item (5) above, wherein the aromatic mercaptan is 2-mercaptobenzothiazole or 2-mercaptobenzoxazole.

(8) The photopolymerizable composition for color filter described in item (1) above, wherein the photopolymerizable compound is a compound having an ethylenically unsaturated double bond and a carboxyl group.

(9) The photopolymerizable composition for color filter described in item (8) above, wherein the photopolymerizable compound having an ethylenically unsaturated double bond and a carboxyl group is a compound represented by the formula (2):

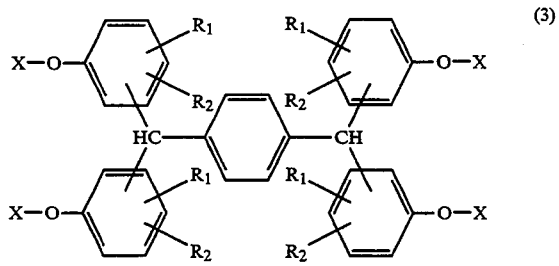

wherein X represents

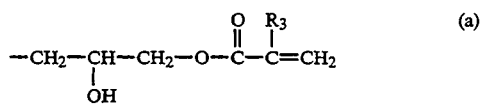

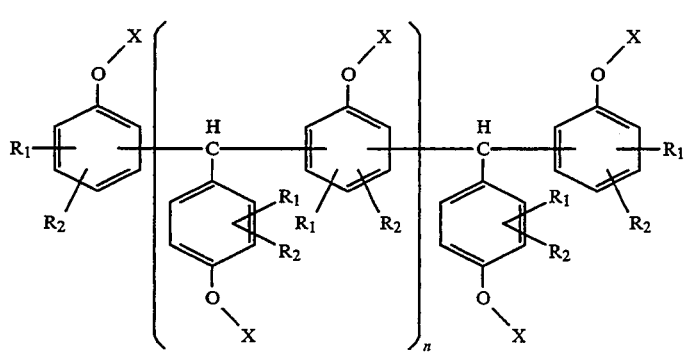

wherein X represents

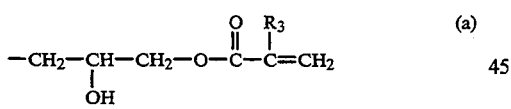

or

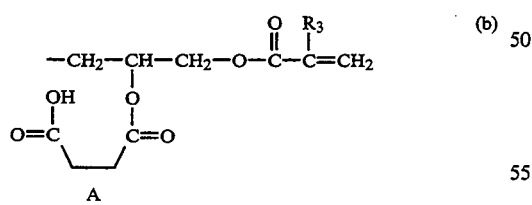

or

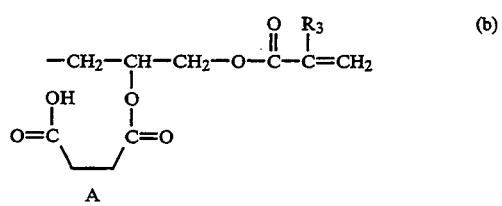

but at least one of X is represented by the formula (b); $R_1$, $R_2$ and $R_3$ independenly represent a hydrogen atom or a methyl group; A represents an aliphatic or cyclic hydrocarbon chain; and n is a number of from 0 to 20.

(10) The photopolymerizable composition for color filter described in item (8) above, wherein the photopolymerizable compound having an ethylenically unsaturated double bond and a carboxyl group is a compound represented by the formula (3):

but at least one of X is represented by the formula (b); $R_1$, $R_2$ and $R_3$ independently represent a hydrogen atom or a methyl group; and A represents an aliphatic or cyclic hydrocarbon chain.

(11) The photopolymerizable composition for color filter described in item (8) above, wherein the photopolymerizable compound having an ethylenically unsaturated double bond and a carboxyl group is a compound represented by the formula (4):

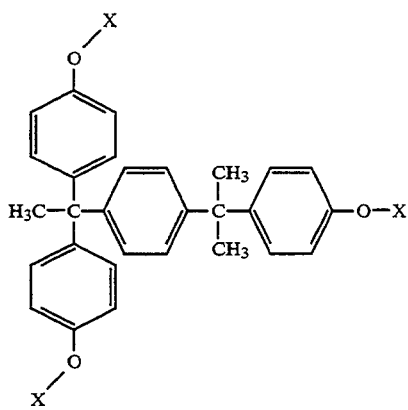

wherein X represents

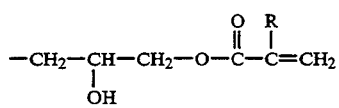

or

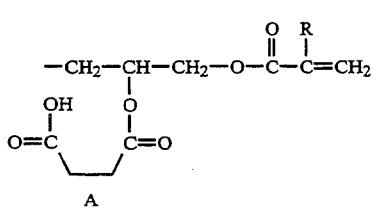

but at least one of X is represented by the formula (b), R represents a hydrogen atom or a methyl group, and A represents an aliphatic or cyclic hydrocarbon chain.

(12) The photopolymerizable composition for color filter described in item (8) above, wherein the photopolymerizable compound having an ethylenically unsaturated double bond and a carboxyl group is a compound represented by the formula (5):

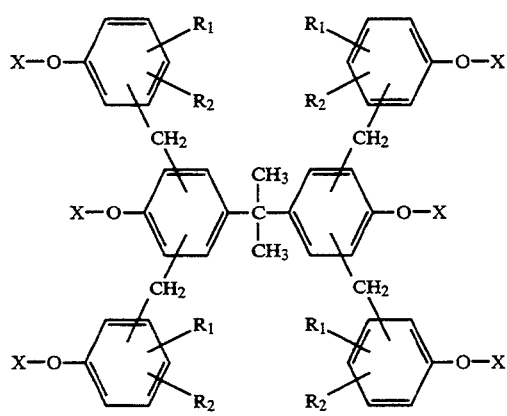

wherein X represents

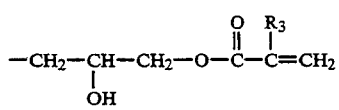

or

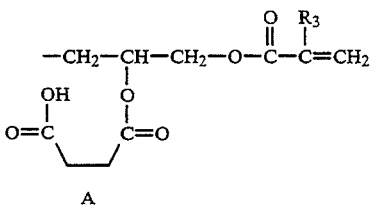

but at least one of X is represented by the formula (b), $R_1$, $R_2$ and $R_3$ independently represent a hydrogen atom or a methyl group, and A represents an aliphatic or cyclic hydrocarbon chain.

(13) The photopolymerizable composition for color filter described in item (8) above, wherein the photopolymerizable compound having an ethylenically unsaturated double bond and a carboxyl group is a compound represented by the formula (6):

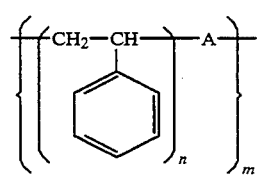

wherein A represents

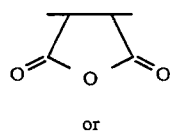

or

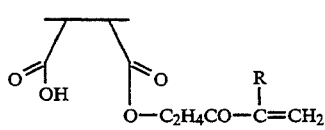

but at least one of A is represented by the formula (d), R represents a hydrogen atom or a methyl group, n is from 1 to 3 and m is from 1 to 20.

(14) The photopolymerizable composition for color filter described in item (1) above, which contains a compound having an epoxy group as another resin.

(15) The photopolymerizable composition for color filter described in item (1) above, wherein the pigment is a pigment treated with a dispersing agent and a derivative of coloring matter.

(16) A color filter obtained from the photopolymerizable composition for color filter described in items (1) to (14).

Further, in the above formulae, although the ratio (a):(b) or (c):(d) can arbitrarily be selected according to development conditions used, the ratios (a):(b) and (c):(d) are usually in a range of 2:1 to 1:3, preferably 1:1 to 1:2.

The photopolymerizable composition for color filter of the invention will be described in detail.

In the present invention, the photosensitive resin composition is prepared so that the proportion of the photopolymerizable compound in the photosensitive resin is not less than 60%, in order to carry out efficiently photpolymerization under exposure to the atmosphere. As the compound having at least one ethylenically unsaturated double bond, the following compounds may be exemplified;

Esters of monovalent or multivalent alcohols and acrylic acid or methacrylic acid, such as, ethyl acrylate, butyl acrylate, hydroxyethyl acrylate, hydroxyethyl methacrylate, ethylene glycol dimethacrylate, pentaerythritol triacrylate, pentaerythritol trimethacrylate, dipentaerythritol hexaacrylate, and dipentaerythritol hexamethacrylate; conventional photopolymerizable resins, for example, polyester (meth)acrylates which are obtained by reacting (meth) acrylic acid with polyester prepolymers which can be obtained by condensing multivalent alcohols and monobasic or multibasic acids; polyurethane (meth)acrylates which are obtained by reacting a polyol group and a compound having two isocyanate groups followed by reaction with (meth)acrylic acid; and epoxy(meth)acrylates which are obtained by reacting (meth)acrylic acid with epoxy resins, such as, bisphenol-A type epoxy resins, bisphenol-F type epoxy resins, novolak-type epoxy resins, polycarboxylic acid glycidyl esters, polyol polyglycidyl esters, aliphatic or aticyclic epoxy resins, amine epoxy resins, triphenolmethane type epoxy resins, and dihydroxybenzene type epoxy resins; can be exemplified.

Among these photopolymerizable compounds, those having an average molecular weight of not less than 1,000 have a high photopolymerization rate under exposure to atmosphere and it is particularly useful to use these compounds in the photosensitive resin compositions. The photopolymerizable compounds described above can be used alone or as a mixture thereof.

As another resin which may optionally be used in the photopolymerizable composition of the present invention, there can be exemplified (film forming) polymer binders. As examples of such polymer binders, any organic polymer binder can be used as far as it is compatible with the photopolymerizable resin described before. For example, polymethacrylic acid esters or their partial hydrolysates; polyvinyl acetate or its hydrolysate; polystyrene; polyvinylbutyral; polychloroprene; polyvinyl chloride; chlorinated polyethylene; chlorinated polypropylene; polyvinyl pyrrolidone; copolymers of styrene and maleic anhydride or their half esters; and copolymers having a glass transition point of not lower than 35° C. and selected from copolymerizable monomers, such as, acrylic acid, acrylic esters, methacrylic acid, methacrylic esters, acrylamide and acrylonitrile. Among them, those having an acidic group such as a carboxyl group can be developed in water and are more advantageous in view of economy and safety in comparison with those which are developed only in an organic solvent.

The above described polymer binders are used within the range of not higher than 40% by weight in the photosensitive resin according to necessity.

In the present invention, a photopolymerizable compound having an acidic group such as carboxyl group in combination with an ethylenically unsaturated double bond may also be used. These compounds are useful in increasing the proportion of photopolymerizable compounds having an ethylenically unsaturated double bond in the photosensitive resin, thereby increasing the polymerization rate under exposure to the atmosphere and permitting development in water, although the above described polymer binders are compounds which are not involved in the photopolymerization.

As an illustrative example, the following can be exemplified.

Namely, epoxy (meth)acrylate-carboxylic acid adducts obtained by reacting (meth)acrylic acid with the epoxy group of epoxy resins, such as, bisphenol-A type epoxy resin, bisphenol-F type epoxy resin, novolak type epoxy resin, polycarboxylic acid glycidyl ester, polyol polyglycidyl ester, aliphatic or alicyclic epoxy resin, amine epoxy resin, triphenolmethane type epoxy resin, and dihydroxybenzene type epoxy resin and reacting an acid anhydride with the hydroxyl group obtained; half-esterified compounds obtained by reacting an acrylate having an alcoholic hydroxyl group such as hydroxyethyl acrylate, or an acrylate having an epoxy group, such as glycidyl methacrylate, with the maleic anhydride moiety of a copolymer of maleic anhydride and a copolymerizable monomer, such as, ethylene, propene, isobutylene, styrene, vinylphenol, acrylic acid, acrylic ester, acrylamide; and compounds obtained by reacting acrylic acid with the hydroxyl group of a copolymer of acrylic acid or acrylic ester and an acrylate having an alcoholic hydroxyl group, such as hydroxyethyl acrylate, can be exemplified. These compounds can be used alone or in a mixture thereof. Further, they can be used together with the photoplymerizable compound described before and are used so that the total weight thereof is not less than 60% of the photosensitive resin.

Further, as the photopolymerizable compound having an ethylenically unsaturated double bond and a carboxyl group, compounds respresented by the above-described formulae (2), (3), (4), (5) and (6) are especially preferred.

In the present invention, an epoxy compound can be used as an optional component to improve the heat resistance. Epoxy compounds thermally react with the above described compounds having a carboxylic acid and improves the heat resistance by cross-linking. As illustrative examples of epoxy compounds, bisphenol-A type epoxy resin, bisphenol-F type epoxy resin, novolak type epoxy resin, polycarboxylic acid glycidyl ester, polyol polyglycidyl ester, aliphatic or alicyclic epoxy resin, amine epoxy resin, triphenolmethane type epoxy resin, and dihydroxybenzene type epoxy resin can be exemplified. If necessary, these compounds are used within the range of not more than 30%, more preferably not more than 20%, based on the weight of photosensitive resin.

As a photopolymerization initiator used in the present invention, various initiators can be used alone or in a mixture. Generally, in colored photopolymerizable resins having pigments dispersed therein, ultraviolet light, which is required for the initiator to generate radicals, may be absorbed by the pigments and radicals are not sufficiently generated; thus, the polymerization may be insufficient. Accordingly, it is necessary to use a highly sensitive compound or composition as the photopolymerization initiator. As an illustrative example of the photopolymerization initiator which may be used, benzyl; benzoin ether; benzoin isobutyl ether; benzoin isopropyl ether; benzophenone; benzoylbenzoic acid; methyl benzoylbenzoate; 4-benzoyl-4'-methyldiphenyl sulfide; benzylmethylketal; 2-n-butoxyethyl-4-dimethylaminobenzoate; 2-chlorothioxanthone; 2,4-diethylthioxanthone; 2,4-diisopropylthioxanthone; dimethylaminomethylbenzoate; isoamyl p-dimethylaminobenzoate; 3,3'-dimethyl-4-methoxybenzophenone; 2,4-dimethylthioxanthone; 1-(4-dodecylphenyl)-2-hydroxy-2-methylpropan-1-on; 1-hydroxycyclohexylphenyl ketone; 2-hydroxy-2-methyl-1-phenylpropan-1-on; 1-(4-isopropylphenyl)-2-hydroxy-2-methylpropan-1-on; isopropylthioxanthone; methylbenzoyl formate; and 2-methyl-1-[4-(methylthio)phenyl]-2-morpholinopropan-1-on can be exemplified. These photopolymerization initiators can be used alone or in a mixture thereof. The amount thereof usd in the photosensitive resin is 0.1 to 20%, preferably 1 to 10%.

When the photopolymerization initiator is used in the form of a composition in the present invention, a preferable composition having particulaly high polymerization rate is a combination of a compound represented by the formula (1) described before and a thioxanthone compound. As an illustrative example of such thioxanthone compound, 2-chlorothioxanthone, 2,4-dimethylthioxanthone, 2,4-diethylthioxanthone, 2,4-diisopropylthioxanthone and isopropylthioxanthone as mentioned above can be exemplified.

The compound represented by the above mentioned formula (1) and the thioxanthone compound are each used in an amount of 0.1 to 10% by weight, preferably 0.1 to 5% by weight, of the photosensitive resin.

Further, as a photopolymerization iniator in the present invention, a hexaarylbisimidazole compound and a hydrogen donor can be used in addition to the mixture of a compound represented by the formula (1) described above and the thioxanthone compound.

Examples of hexaarylbisimidazole compound are disclosed in U.S. Pat. No. 3,784,557 or EP-A-24629. Those which are especially good in stability and sensitivity include 2,2'-bis(o-chlorophenyl)-4,4',5,5'-tetra-(p-methoxyphenyl)-bisimidazolyl and the compound is used in 0.1 to 10% by weight, preferably 0.1 to 5% by weight, based on the photosensitive resin.

As the hydrogen donor, an aromatic mercaptan compound and an aromatic amine compound can be usd. As the aromatic mercaptan hydrogen donor, a compound which has a benzene or heterocyclic ring as a base structure and one or two mercapto groups is good. When the donor has two substituent groups, one mercapto group may be substituted by an alkyl, aralkyl or phenyl group or the donor may be a dimer in the form of a disulfide.

As a preferable example, 2-mercaptobenzothiazole and 2-mercaptobenzoxazol, etc. can be exemplified. The amount of the donor used is 0.1 to 10% by weight, preferably 0.1 to 5% by weight, based on the photosensitive resin.

As the aromatic amine hydrogen donor, a compound which has a benzene or heterocyclic ring as a base structure and one or two amino groups is good. The amino group may be substituted with an alkyl group or a substituted alkyl group. The monoamino substituted compound may be further substituted with a carboxy group, an alkoxycarbonyl group, a substituted alkoxycarbonyl group, a phenoxycarbonyl group, a substituted phenoxycarbonyl group or a nitryl group. As a particularly preferable one, compounds represented by the following formulae (7) to (12) can be exemplified.

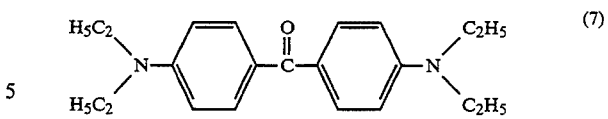

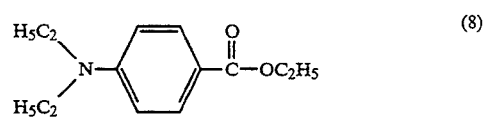

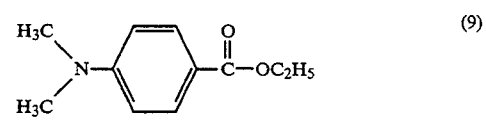

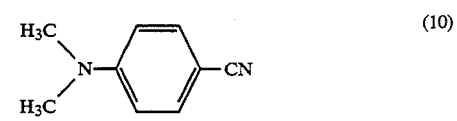

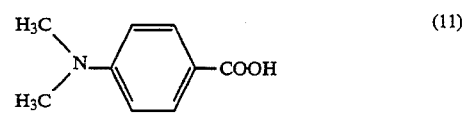

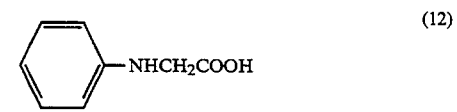

These may optionally be used in an amount of 0.1 to 10% by weight, preferably 0.1 to 5% by weight, based on the photosensitive resin.

Since transparency to visible light is required, pigments used in the photopolymerizable composition for color filter of the present invention desirably have a particle size which is not larger than half of wave length of transmitting visible light, and preferably pigments dispersed in a number average particle size of not larger than 200 nm is more desirable. It is usually preferable that these pigments are dispersed by means of a dispersing agent and an organic solvent. As the organic solvent, ethylcellosolve, methylcellosolve, propylcellosolve, butylcellosolve or an acetylated product of these cellosolves is used.

As preferable examples, phthalocyanine pigments, etc. for blue pigments; quinacridone pigments, perylene pigments, pyrrolo pyrrole pigments, anthraquinone pigments, etc. for red pigment; and halogenated phthalocyanine pigments for green pigment can be exemplified. These pigments can be usd alone or in a combined (toning) form. Further, as a pigment for black matrix, carbon, titan carbon, iron oxide, azo black pigment, etc. can be used alone or in combination.

These fine particle pigment is used in the range of 10 to 60% by weight, preferably 20 to 50% by weight, based on the photosensitive resin.

The photopolymerizable composition of the present invention is usually diluted with an organic solvent when used. As the organic solvent, although any solvent which can dissolve all components of the photopolymerizable composition of the present invention except pigment may be used, those solvents which do not have a tendency to dry during coating process with a coating machine such as spinner, etc. and which evaporate slowly, are preferably used as good solvent. An illustrative example of such organic solvents may include ethylcellosolve, methylcellosolve, propylcellosolve, butylcellosolve or an acetylated product of these cellosolves. The photopolymerizable composition of the present invention is usually dissolved with an organic solvent of 1 to 5 times (weight ratio) the weight of solid substances in the composition.

The photopolymerizable composition for color filter of the present invention can be obtained by mixing the photopolymerizable compound(s), the photopolymerization initiator(s), the pigment(s), the solvent(s) and optionally other resin(s) in ratios described above. The mixing is preferably performed by treating with a usual mixer or a disperser. The obtained photopolymerizable composition for color filter of the present invention may be filtered to remove coarse particles and foreign matters. In the filtration, a filter having a pore size of not larger than 1 μm, preferably not larger than 0.5 μm, is used.

A general process for manufacturing a color filter with the photopolymerizable composition of the present invention is as follows.

The photopolymerizable composition of the present invention is dissolved in the solvent, and the solution is coated on a substrate for electronic part, such as glass plate, plastic plate, silicon wafer for image pick-up device, etc. in a thickness in dry state of 0.5 to 10 μm, preferably 1 to 3 μm, followed by drying the solvent to form smooth coated film. Ultra violet rays are irradiated through a negative mask on the coated film to form a desired image. In the irradiation, it is preferable to use a device, such as mask alignment, etc. to irradiate the film surface uniformly with parallel rays. Then, after promoting the polymerization of the irradiated film by heating for a short time, the film is exposed to a flow or shower of a development liquid and developed it by dissolving an unsolidified part. With this development, the desired image (color filter) is obtained.

BRIEF EXPLANATION OF THE DRAWING

FIG. 1 is a spectrum of a color filter obtained in Application Example 1. In the figure, the abscissa represents wave length (nm) and the ordinate represents absorbance.

THE BEST MODE OF PRACTICING THE PRESENT INVENTION

Hereinafter, the present invention will be described more in detail, but the present invention is not limited to these examples only.

EXAMPLE 1

A photosensitive resin composition having the following composition was prepared.
(Photopolymerizable Compound)
 13.5 g of KAYARAD DPHA, manufactured by Nippon Kayaku (acrylic ester compound);
 18.0 g of KAYARAD R2089, manufactured by Nippon Kayaku (acrylic ester compound).
(Polymer Binder)
 13.5 g of SMA2625, manufactured by Arco Chemical (copolymer of styrene and maleic acid).
(Photopolymerization Initiator)
 1.0 g of 2-benzyl-2-dimethylamino-1-(4-morpholinophenyl)butanone; and
 0.5 g of 2,4-diethylthioxanthone.
(Solvent)
 100.0 g of ethyl cellosolve acetate.

Pastes of fine particle pigments of red, green, blue and black to be added to the photosensitive resin composition described above were prepared as follows. In Table 1, the mixing ratio is by weight.

TABLE 1

| Pigments Used and Their Mixing Ratio | | | |
|---|---|---|---|
| | Pigment used | | Mixing Ratio |
| Red | CI Pigment red | 177 | 75 |
| | CI Pigment yellow | 83 | 25 |
| Green | CI Pigment green | 36 | 90 |
| | CI Pigment yellow | 83 | 10 |
| Blue | CI Pigment blue | 15 | 95 |
| | CI Pigment violet | 23 | 5 |
| Black | Carbon black | | 100 |

To 20 g of each mixture of the pigments described above, 4 g of sorbitan fatty acid ester compound was added as dispersing agent, and 76 g of ethyl cellosolve acetate was further added. The mixture was dispersed with a sand mill.

Further, a dispersion having excellent fluidity was obtained when conventionally known pigment derivatives were added and dispersed in the same manner as described above.

Each average particle number distribution of the dispersed particles of red, green, and blue pigments was not more than 200 nm. 40% by weight of the paste of fine particle pigments was added to the above described photosensitive resin composition, treated with a sand mill, and filtered through a 1 μm filter of a filter press to obtain a photopolymerizable composition for color filter.

Application Example 1

On a smooth glass plate washed with water, alcohol, then fleon, the photopolymerizable composition for color filter obtained in Example 1 was coated by a spin coater, and dried at 100° C. for 5 minutes. Thus obtained coated film was exposed to light through a negative mask by Maskaligner-MA-10 (manufactured by Mikasa Co., Ltd.) under atmospheric environment. Then, the film was prebaked at 100° C. for 15 minutes, and developed by a flow of 1% by weight of aqueous sodium carbonate solution at 25° C. for 60 seconds to obtain a color filter.

The coated film thickness of the color filter for each color obtained in the above described manner is shown below.

TABLE 2

| Pigment | Film Thickness |
|---|---|
| Red | 2.0μ |
| Green | 2.0μ |
| Blue | 1.6μ |
| Black | 0.8μ |

The spectra of the color filters obtained under the above conditions are shown in FIG. 1.

Examples 2 to 42 and Application Examples 2 to 42

Photopolymerizable compositions for color filter were prepared in the same manner as in Example 1 using resin compositions shown in Tables 3 to 16 and color filters were prepared in the same manner as in Application Example 1. Raw materials used are shown below.
 Group A (Photopolymerizable Compound)

(1) KAYARAD DPHA, manufactured by Nippon Kayaku (acrylic ester compound).
(2) KAYARAD RP1040, manufactured by Nippon Kayaku (acrylic ester compound).
(3) KAYARAD TMPTA, manufactured by Nippon Kayaku (acrylic ester compound).
(4) KAYARAD FM100, manufactured by Nippon Kayaku (acrylic ester compound).
(5) Dipentaerythritolhexamethacrylate.
(6) KAYARAD R2089, manufactured by Nippon Kayaku (acrylic ester compound).

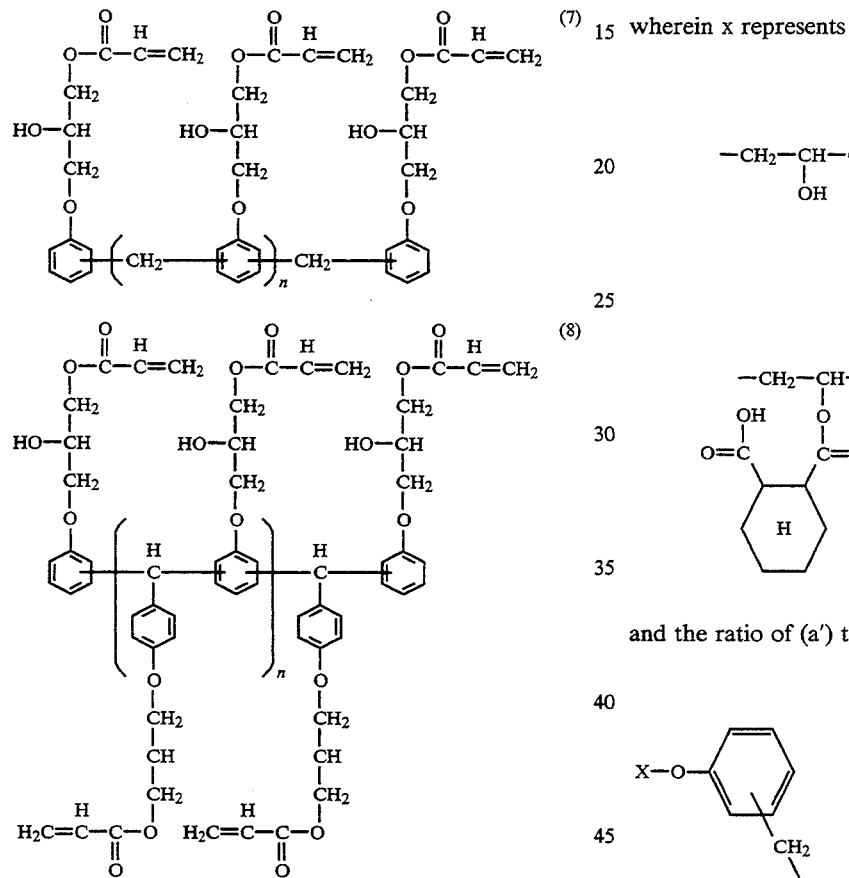

Group B (Polymer binder)
(9) SMA2625, manufactured by Arco Chemical (copolymer of styrene and maleic acid).
(10) SMA17352, manufactured by Arco Chemical (copolymer of styrene and maleic acid).
(11) Copolymer of benzyl methacrylate and methacrylic acid (molar ratio: 70/30).
(12) Copolymer of ethyl methacrylate and methacrylic acid (molar ratio: 70/30).

Group C (Compound having ethylenically unsaturated double bond and carboxyl group).
(13) KAYARAD R849, manufactured by Nippon Kayaku.
(14) KAYARAD R5107, manufactured by Nippon Kayaku.
(15) KAYARAD R5197, manufactured by Nippon Kayaku.
(16) KAYARAD R5201, manufactured by Nippon Kayaku.

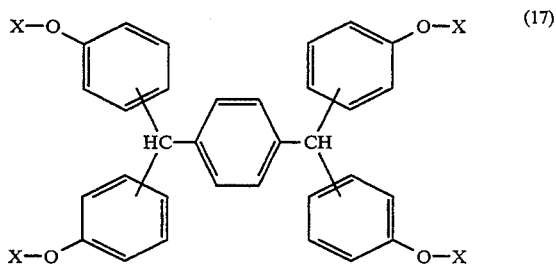

wherein x represents $$-CH_2-CH-CH_2-O-\overset{O}{\overset{\|}{C}}-\overset{H}{\underset{}{C}}=CH_2 \quad (a')$$
$$\phantom{-CH_2-CH}\underset{OH}{|}$$

or (b')
a structure with $-CH_2-CH-CH_2-O-\overset{O}{\overset{\|}{C}}-\overset{H}{C}=CH_2$ with a cyclohexane-dicarboxylate group and the ratio of (a') to (b') is 1:2.

(18)

wherein X represents $$-CH_2-CH-CH_2-O-\overset{O}{\overset{\|}{C}}-\overset{H}{C}=CH_2 \quad (a')$$
$$\phantom{-CH_2-CH}\underset{OH}{|}$$

or

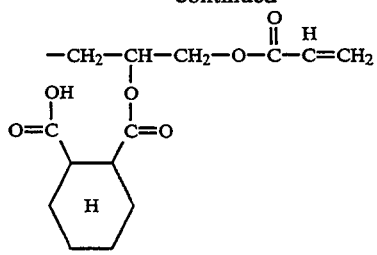

and the ratio of (a') to (b') is 1:2.

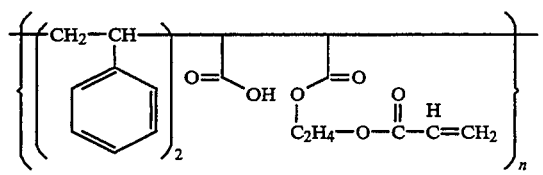

Group D (Epoxy resin)
(20) AK601 manufactured by Nippon Kayaku (glycidyl ester compound).
(21) XGE manufactured by Nippon Kayaku (epoxy compound).
(22) RGE manufactured by Nippon Kayaku (epoxy compound).
(23) Epicoat 828 manufactured by Yuka Shell Epoxy (epoxy compound).

Group E (Photopolymerization initiator)
(24) IRGACURE 369 manufactured by Ciba-Geigy.
(25) IRGACURE 907 manufactured by Ciba-Geigy.
(26) KAYACURE DETX manufactured by Nippon Kayaku.
(27) KAYACURE EPA manufactured by Nippon Kayaku.
(28) Isopropyl Ithioxanthone.
(29) 2,2'-bis(o-chlorophenyl)-4,4',5,5'-tetraphenyl-bisimidazolyl.
(30) 2,2'-bis(o-chlorophenyl)-4,4',5,5'-tetra(p-methoxyphenyl)bisimidazolyl.
(31) 2-mercaptobenzothiazole.
(32) 2-mercaptobenzoxazole.
(33) Miharase ketone.
(34) 4-(p-methoxyphenyl)-2,6-di(trichloromethyl)-s-triazine.

TABLE 3

|  | Example 2 | | Example 3 | | Example 4 | |
|---|---|---|---|---|---|---|
| Group A | (1) | 9.0 g | (2) | 13.0 g | (3) | 9.0 g |
|  | (6) | 23.3 g | (6) | 18.0 g | (6) | 23.3 g |
| Group B | (9) | 11.3 g | (9) | 13.5 g | (9) | 11.3 g |
| Group C | — | | — | | — | |
| Group D | — | | — | | — | |
| Group E | (24) | 2.0 g | (24) | 1.0 g | (24) | 2.0 g |
|  | (26) | 1.0 g | (26) | 0.5 g | (26) | 1.0 g |
|  | (29) | 0.5 g | — | | (30) | 1.0 g |
|  | (31) | 0.5 g | — | | (32) | 1.0 g |

TABLE 4

|  | Example 5 | | Example 6 | | Example 7 | |
|---|---|---|---|---|---|---|
| Group A | (4) | 13.0 g | (1) | 9.0 g | (4) | 13.0 g |
|  | (6) | 18.0 g | (7) | 23.3 g | (8) | 18.0 g |
| Group B | (9) | 13.5 g | (9) | 11.3 g | (9) | 13.5 g |
| Group C | — | | — | | — | |
| Group D | — | | — | | — | |
| Group E | (24) | 1.0 g | (24) | 2.0 g | (24) | 1.0 g |
|  | (28) | 0.5 g | (28) | 1.0 g | (26) | 0.5 g |

TABLE 4-continued

|  | Example 5 | | Example 6 | | Example 7 | |
|---|---|---|---|---|---|---|
|  | — | | (29) | 0.5 g | (30) | 0.5 g |
|  | — | | (31) | 0.5 g | (32) | 0.5 g |

TABLE 5

|  | Example 8 | | Example 9 | | Example 10 | |
|---|---|---|---|---|---|---|
| Group A | (1) | 9.0 g | (1) | 13.0 g | (1) | 9.0 g |
|  | (6) | 23.3 g | (6) | 18.0 g | (6) | 23.3 g |
| Group B | (10) | 11.3 g | (11) | 13.5 g | (12) | 11.3 g |
| Group C | — | | — | | — | |
| Group D | — | | — | | — | |
| Group E | (34) | 2.0 g | (25) | 1.0 g | (25) | 2.0 g |
|  | — | | (26) | 0.5 g | (28) | 1.0 g |
|  | — | | — | | (29) | 1.0 g |
|  | — | | — | | (31) | 1.0 g |

TABLE 6

|  | Example 11 | | Example 12 | | Example 13 | |
|---|---|---|---|---|---|---|
| Group A | (6) | 20.3 g | (6) | 15.8 g | (6) | 18.0 g |
|  | (1) | 11.2 g | (1) | 11.2 g | (1) | 9.0 g |
| Group B | — | | — | | — | |
| Group C | — | | — | | — | |
| Group D | (13) | 13.5 g | (13) | 18.0 g | (13) | 18.0 g |
| Group E | (24) | 2.0 g | (24) | 2.0 g | (24) | 2.0 g |
|  | (26) | 1.0 g | (26) | 1.0 g | (26) | 1.0 g |
|  | (29) | 1.0 g | (29) | 1.0 g | (29) | 0.5 g |
|  | (33) | 1.0 g | (27) | 1.0 g | (31) | 0.5 g |

TABLE 7

|  | Example 14 | | Example 15 | | Example 16 | |
|---|---|---|---|---|---|---|
| Group A | (6) | 15.8 g | (6) | 13.5 g | (6) | 15.8 g |
|  | (1) | 8.1 g | (1) | 9.0 g | (1) | 8.1 g |
| Group B | — | | — | | — | |
| Group C | — | | — | | — | |
| Group D | (14) | 21.1 g | (15) | 22.5 g | (16) | 21.1 g |
| Group E | (24) | 2.0 g | (24) | 1.0 g | (24) | 2.0 g |
|  | (26) | 1.0 g | (26) | 0.5 g | (26) | 1.0 g |
|  | (29) | 0.5 g | — | | (30) | 1.0 g |
|  | (31) | 0.5 g | — | | (32) | 1.0 g |

TABLE 8

|  | Example 17 | | Example 18 | | Example 19 | |
|---|---|---|---|---|---|---|
| Group A | (6) | 13.5 g | (6) | 13.5 g | (6) | 18.0 g |
|  | (1) | 9.0 g | (1) | 9.0 g | (1) | 13.5 g |
| Group B | — | | — | | — | |
| Group C | — | | — | | — | |
| Group D | (17) | 22.5 g | (18) | 22.5 g | (19) | 13.5 g |
| Group E | (24) | 1.0 g | (24) | 2.0 g | (24) | 1.0 g |
|  | (28) | 0.5 g | (28) | 1.0 g | (26) | 0.5 g |
|  | — | | (29) | 0.5 g | (30) | 0.5 g |
|  | — | | (31) | 0.5 g | (32) | 0.5 g |

TABLE 9

|  | Example 20 | | Example 21 | | Example 22 | |
|---|---|---|---|---|---|---|
| Group A | (7) | 20.3 g | (8) | 15.8 g | (6) | 18.0 g |
|  | (1) | 11.2 g | (1) | 11.2 g | (2) | 9.0 g |
| Group B | — | | — | | — | |
| Group C | — | | — | | — | |
| Group D | (13) | 13.5 g | (13) | 18.0 g | (13) | 18.0 g |
| Group E | (34) | 2.0 g | (25) | 1.0 g | (25) | 2.0 g |
|  | — | | (26) | 0.5 g | (28) | 1.0 g |
|  | — | | — | | (29) | 1.0 g |
|  | — | | — | | (31) | 1.0 g |

TABLE 10

|  | Example 23 | | Example 24 | | Example 25 | |
|---|---|---|---|---|---|---|
| Group A | (6) | 15.8 g | (6) | 13.5 g | (6) | 15.8 g |

TABLE 10-continued

|  | Example 23 | | Example 24 | | Example 25 | |
|---|---|---|---|---|---|---|
|  | (3) | 8.1 g | (4) | 9.0 g | (5) | 8.1 g |
| Group B | — | | — | | — | |
| Group C | — | | — | | — | |
| Group D | (14) | 21.1 g | (15) | 22.5 g | (16) | 21.1 g |
| Group E | (24) | 2.0 g | (24) | 2.0 g | (24) | 2.0 g |
|  | (26) | 1.0 g | (26) | 1.0 g | (26) | 1.0 g |
|  | (29) | 1.0 g | (29) | 1.0 g | (29) | 0.5 g |
|  | (33) | 1.0 g | (27) | 1.0 g | (31) | 0.5 g |

TABLE 11

|  | Example 26 | | Example 27 | | Example 28 | |
|---|---|---|---|---|---|---|
| Group A | (6) | 19.3 g | (6) | 18.3 g | (6) | 19.3 g |
|  | (1) | 10.6 g | (1) | 10.0 g | (1) | 10.6 g |
| Group B | — | | — | | — | |
| Group C | (20) | 2.3 g | (20) | 4.5 g | (21) | 2.3 g |
| Group D | (13) | 12.8 g | (13) | 12.2 g | (13) | 18.0 g |
| Group E | (24) | 2.0 g | (24) | 1.0 g | (24) | 2.0 g |
|  | (26) | 1.0 g | (26) | 0.5 g | (26) | 1.0 g |
|  | (29) | 0.5 g | | | (30) | 1.0 g |
|  | (31) | 0.5 g | | | (32) | 1.0 g |

TABLE 12

|  | Example 29 | | Example 30 | | Example 31 | |
|---|---|---|---|---|---|---|
| Group A | (6) | 18.3 g | (6) | 19.3 g | (6) | 18.3 g |
|  | (1) | 10.0 g | (1) | 10.6 g | (1) | 10.0 g |
| Group B | — | | — | | — | |
| Group C | (21) | 4.5 g | (22) | 2.3 g | (22) | 4.5 g |
| Group D | (13) | 12.2 g | (13) | 12.8 g | (13) | 12.2 g |
| Group E | (24) | 1.0 g | (24) | 2.0 g | (24) | 2.0 g |
|  | (26) | 0.5 g | (26) | 1.0 g | (26) | 1.0 g |
|  | (29) | 0.5 g | (29) | 0.5 g | (29) | 0.5 g |
|  | (31) | 0.5 g | (31) | 0.5 g | (31) | 0.5 g |

TABLE 13

|  | Example 32 | | Example 33 | | Example 34 | |
|---|---|---|---|---|---|---|
| Group A | (6) | 19.3 g | (6) | 18.3 g | (6) | 15.3 g |
|  | (1) | 10.6 g | (1) | 10.0 g | (1) | 14.6 g |
| Group B | — | | — | | — | |
| Group C | (23) | 2.3 g | (23) | 4.5 g | (22) | 4.5 g |
| Group D | (13) | 12.8 g | (13) | 12.2 g | (13) | 12.8 g |
| Group E | (24) | 2.0 g | (24) | 2.0 g | (24) | 2.0 g |
|  | (26) | 1.0 g | (26) | 1.0 g | (26) | 1.0 g |
|  | (29) | 0.5 g | (29) | 0.5 g | (29) | 0.5 g |
|  | (31) | 0.5 g | (31) | 0.5 g | (31) | 0.5 g |

TABLE 14

|  | Example 35 | | Example 36 | | Example 37 | |
|---|---|---|---|---|---|---|
| Group A | (6) | 15.0 g | (6) | 12.8 g | (6) | 15.0 g |
|  | (1) | 7.7 g | (1) | 8.6 g | (1) | 7.7 g |
| Group B | — | | — | | — | |
| Group C | (20) | 2.3 g | (20) | 2.3 g | (20) | 2.3 g |
| Group D | (14) | 20.0 g | (15) | 21.4 g | (16) | 20.0 g |
| Group E | (24) | 2.0 g | (24) | 1.0 g | (24) | 2.0 g |
|  | (26) | 1.0 g | (26) | 0.5 g | (26) | 1.0 g |
|  | (29) | 0.5 g | | | (30) | 1.0 g |
|  | (31) | 0.5 g | | | (32) | 1.0 g |

TABLE 15

|  | Example 38 | | Example 39 | | Example 40 | |
|---|---|---|---|---|---|---|
| Group A | (6) | 12.8 g | (6) | 12.8 g | (6) | 17.1 g |
|  | (1) | 8.6 g | (1) | 8.6 g | (1) | 12.8 g |
| Group B | — | | — | | — | |
| Group C | (20) | 2.3 g | (20) | 2.3 g | (20) | 2.3 g |
| Group D | (17) | 21.4 g | (18) | 21.4 g | (19) | 12.8 g |
| Group E | (24) | 1.0 g | (24) | 2.0 g | (24) | 1.0 g |
|  | (28) | 0.5 g | (28) | 1.0 g | (26) | 0.5 g |
|  | — | | (29) | 0.5 g | (30) | 0.5 g |

TABLE 15-continued

|  | Example 38 | | Example 39 | | Example 40 | |
|---|---|---|---|---|---|---|
|  | — | | (31) | 0.5 g | (32) | 0.5 g |

TABLE 16

|  | Example 41 | | Example 42 | |
|---|---|---|---|---|
| Group A | (6) | 19.3 g | (6) | 18.3 g |
|  | (1) | 10.6 g | (1) | 10.0 g |
| Group B | (9) | 6.4 g | (9) | 6.1 g |
| Group C | — | | (20) | 4.5 g |
| Group D | (13) | 6.4 g | (13) | 6.1 g |
| Group E | (24) | 2.0 g | (24) | 1.0 g |
|  | (26) | 1.0 g | (26) | 0.5 g |
|  | (29) | 0.5 g | (29) | 0.5 g |
|  | (31) | 0.5 g | (31) | 0.5 g |

Comparative Example 1

A photopolymerizable composition for color filter was prepared using the following resin mixture in the same manner as in Example 1.

(Photopolymerizable compound)
18.0 g of KAYARAD DPHA manufactured by Nippon Kayaku.

(Polymer initiator)
1.0 g of 2-benzyl-2-dimethylamino-1-(4-morpholinophenyl)butanone, and
0.5 g of 2,4-diethylthioxanthone.

(Solvent)
100.0 g of ethylcellosolve acetate.

A color filter was prepared by using the above composition in the same manner as in Application Example 1. However, the photopolymerization was insufficient and the image exfoliated during its development.

Industrial Utility

A color filter having high image resolution, good heat resistance and light resistance can be manufactured with a simple process.

What is claimed is:

1. A photopolymerizable composition for color filter containing a photosensitive resin which comprises a photopolymerizable compound having at least one ethylenically unsaturated double bond, a photopolymerization initiator, and a pigment characterized in that said photopolymerizable compound is contained in an amount not less than 60% by weight of the photosensitive resin and said pigment is used in an amount of 10 to 60% by weight based on the photosensitive resin.

2. The photopolymerizable composition for color filter according to claim 1, wherein said photopolymerization initiator is a mixture comprising a compound represented by the formula (1):

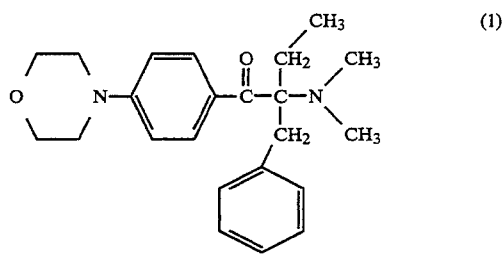

a thioxanthone compound and optionally another photopolymerization initiator.

3. The photopolymerizable composition for color filter according to claim 2, wherein said another photopolymerization initiator comprises a hexaarylbisimidazole compound and a hydrogen donor.

4. The photopolymerizable composition for color filter according to claim 3, wherein said hydrogen donor is an aromatic mercaptan.

5. The photopolymerizable composition for color filter according to claim 4, wherein said aromatic mercaptan is 2-mercaptobenzothiazole or 2-mercaptobenzoxazole.

6. The photopolymerizable composition for color filter according to claim 3, wherein said hydrogen donor is an aromatic amine.

7. The photopolymerizable composition for color filter according to claim 1, wherein said photopolymerizable compound is a compound having an ethylenically unsaturated double bond and a carboxyl group.

8. The photopolymerizable composition for color filter according to claim 7, wherein said photopolymerizable compound having an ethylenically unsaturated double bond and a carboxyl group is a compound represented by the formula (2):

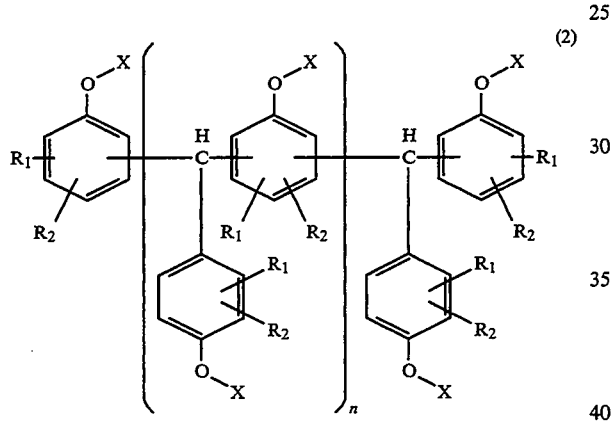

wherein X represents

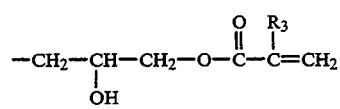

or

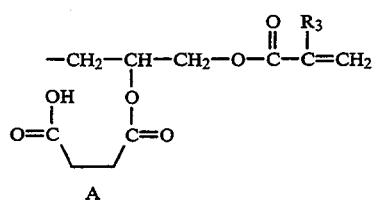

but at least one of X is represented by the formula (b); $R_1$, $R_2$ and $R_3$ independently represent a hydrogen atom or a methyl group; A represents an aliphatic or cyclic hydrocarbon chain; and n is a number of from 0 to 20.

9. The photopolymerizable composition for color filter according to claim 7, wherein said photopolymerizable compound having an ethylenically unsaturated double bond and a carboxyl group is a compound represented by the formula (3):

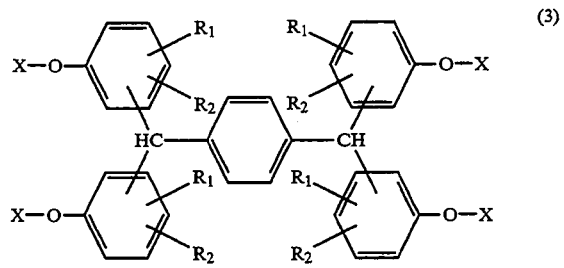

wherein X represents

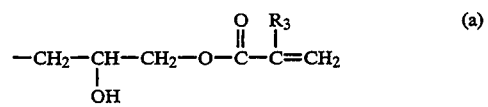

or

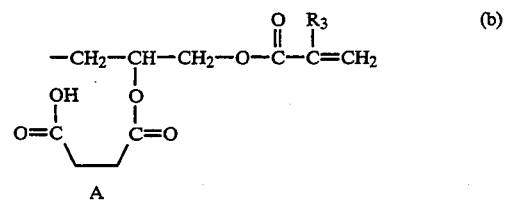

but at least one of X is represented by the formula (b); $R_1$, $R_2$ and $R_3$ independently represent a hydrogen atom or a methyl group; and A represents an aliphatic or cyclic hydrocarbon chain.

10. The photopolymerizable composition for color filter according to claim 7, wherein said photopolymerizable compound having an ethylenically unsaturated double bond and a carboxyl group is a compound represented by the formula (4):

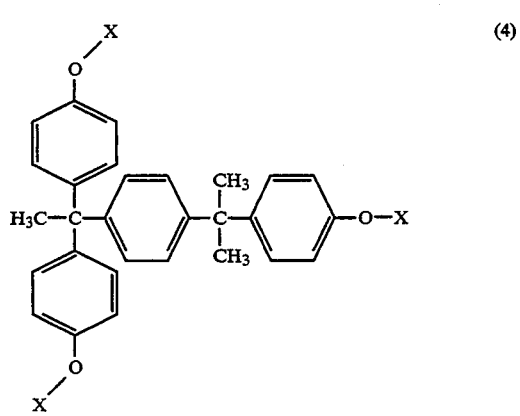

wherein X represents

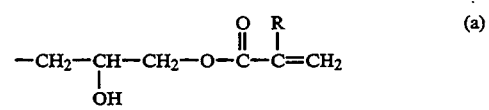

or

-continued

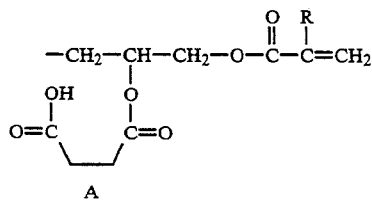

but at least one of X is represented by the formula (b), R represents a hydrogen atom or a methyl group, and A represents an aliphatic or cyclic hydrocarbon chain.

11. The photopolymerizable composition for color filter according to claim 7, wherein said photopolymerizable compound having an ethylenically unsaturated double bond and a carboxyl group is a compound represented by the formula (5):

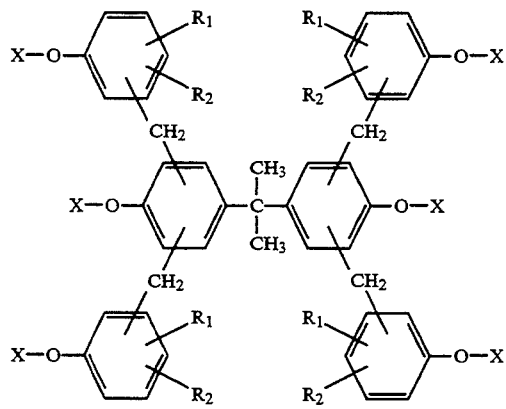

wherein X represents

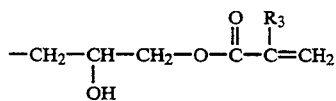

or

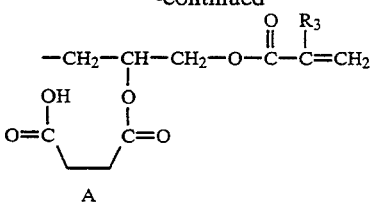

but at least one of X is represented by the formula (b), $R_1$, $R_2$ and $R_3$ independently represent a hydrogen atom or a methyl group, and A represents an aliphatic or cyclic hydrocarbon chain.

12. The photopolymerizable composition for color filter according to claim 7, wherein said photopolymerizable compound having an ethylenically unsaturated double bond and a carboxyl group is a compound represented by the formula (6):

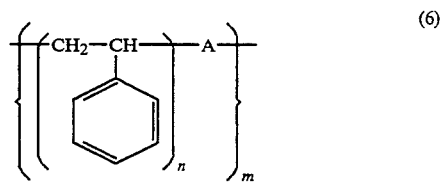

wherein A represents

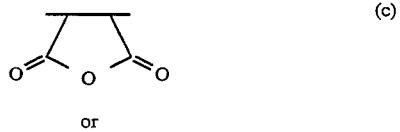

or

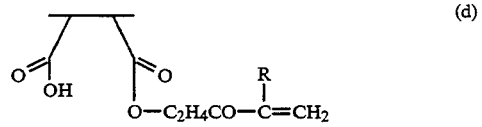

but at least one of A is represented by the formula (d), R represents a hydrogen atom or a methyl group, n is from 1 to 3 and m is from 1 to 20.

13. The photopolymerizable composition for color filter according to claim 1, which further comprises a compound having an epoxy group.

14. The photopolymerizable composition for color filter according to claim 1, wherein said pigment is a pigment treated with a dispersing agent and a derivative of coloring matter.

15. The photopolymerizable composition for color filter according to claim 1, wherein said photosensitive resin further comprises a binder resin.

* * * * *